(12) United States Patent
Yoon et al.

(10) Patent No.: US 9,159,453 B2
(45) Date of Patent: Oct. 13, 2015

(54) MEMORY DEVICE AND METHOD FOR MEASURING RESISTANCE OF MEMORY CELL

(75) Inventors: Hyunsu Yoon, Gyeonggi-do (KR); Jeongsu Jeong, San Jose, CA (US); Yongho Seo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 543 days.

(21) Appl. No.: 13/546,255

(22) Filed: Jul. 11, 2012

(65) Prior Publication Data

US 2014/0015553 A1 Jan. 16, 2014

(51) Int. Cl.
*G11C 11/00* (2006.01)
*G11C 29/02* (2006.01)
*G11C 29/50* (2006.01)

(52) U.S. Cl.
CPC ........ *G11C 29/027* (2013.01); *G11C 29/50008* (2013.01)

(58) Field of Classification Search
CPC ................................ G11C 11/00; G01R 27/08
USPC ................................. 324/713; 365/148, 201
See application file for complete search history.

(56) References Cited

U.S. PATENT DOCUMENTS

| 7,269,047 | B1 | 9/2007 | Fong et al. | |
|---|---|---|---|---|
| 7,573,273 | B2 * | 8/2009 | Yanagida | 324/550 |
| 2007/0147146 | A1 * | 6/2007 | Yamada et al. | 365/200 |

OTHER PUBLICATIONS

Dictionary of Electronics Rufus Turner and Stan Gibilison 1988.*

* cited by examiner

*Primary Examiner* — Arleen M Vazquez
*Assistant Examiner* — Brent J Andrews
(74) *Attorney, Agent, or Firm* — IP & T Group LLP

(57) ABSTRACT

A memory device includes a plurality of resistive memory units configured to receive a voltage of a corresponding line of a plurality of program/read lines, a plurality of switch units configured to each electrically connect a corresponding one of the resistive memory units with a corresponding line of a plurality of column lines in response to a voltage of a corresponding line of a plurality of row lines, where the program/read lines correspond to the row lines, respectively, a row control circuit configured to turn on the switch units by selecting at least one of the row lines and apply an external voltage to a program/read line corresponding to the selected row line in a first test mode, and a column control circuit configured to select at least one of the column lines and couple the selected column line with a ground voltage terminal in the first test mode.

8 Claims, 4 Drawing Sheets

MEMORY DEVICE AND METHOD FOR MEASURING RESISTANCE OF MEMORY CELL

BACKGROUND

1. Field

Exemplary embodiments of the present invention relate to a memory device, and more particularly, to a technology for measuring resistance of a memory cell in the memory device.

2. Description of the Related Art

Generally, a fuse may be programmed in the wafer stage of a memory chip because data are sorted out depending on whether the fuse is cut or not by a laser. The fuse mounted in the package stage of the memory chip may not be programmed.

To more easily program the fuse of the memory chip, an e-fuse is used, which stores a data by using a transistor and changing resistance between a gate and a drain/source of the transistor.

FIG. 1 illustrates an e-fuse formed of a transistor and operating as a resistor or a capacitor.

Referring to FIG. 1, the e-fuse is formed of a transistor T, and a power supply voltage is applied to a gate G of the transistor T while a ground voltage is applied to a drain/source D/S thereof.

When a power supply voltage having such a level that the transistor T may bear is applied to the gate G, the e-fuse operates as a capacitor C. Therefore, no current flows between the gate G and the drain/source D/S. When a high power supply voltage having such a voltage level that the transistor T may not bear is applied to the gate G, a gate oxide of the transistor T is destroyed to cause the coupling between the gate G and the drain/source D/S and the e-fuse operates as a resistor R. Therefore, current flows between the gate G and the drain/source D/S. According to this phenomenon, a data of an e-fuse is recognized based on the resistance value between the gate G and the drain/source D/S of the e-fuse. Here, the data of the e-fuse may be recognized by 1) enlarging the size of the transistor T without additionally performing a sensing operation, or by 2) using an amplifier and sensing the current flowing through the transistor T instead of increasing the size of the transistor T. The two methods, however, have a dimensional restriction because the large size of the transistor T is to be designed or an amplifier for amplifying a data is to be added to each e-fuse.

U.S. Pat. No. 7,269,047 discloses a method for decreasing the area occupied by an e-fuse by forming an e-fuse array.

FIG. 2 is a block view illustrating a conventional memory device formed of an e-fuse array.

Referring to FIG. 2, the memory device includes a cell array including a plurality of memory cells 201, 202, 203 and 204, a row control circuit 210, a voltage supplier 220, and a column control circuit 230.

The memory cells 201, 202, 203 and 204 include memory units M1, M2, M3 and M4 and switch units S1, S2, S3 and S4, respectively. Each of the memory units M1, M2, M3 and M4 is an e-fuse that has characteristics of a resistor or a capacitor depending on whether the e-fuse is ruptured or not. In other words, the memory units M1, M2, M3 and M4 may be regarded as resistive memory devices for storing data based on their resistance values. The switch units S1, S2, S3 and S4 electrically connect the memory units M1, M2, M3 and M4 with column lines BL0 and BL1 under the control of row lines WLR0 and WLR1.

The row control circuit 210 includes a row decoder 211 and a plurality of voltage transformers VT 212 and 213. The row decoder 211 activates a signal of a selected row line, among the row lines WLR0 and WLR1, into a logic high level by decoding an address ADD to turn on a switch unit of the corresponding row. The voltage transformers VT 212 and 213 supply program/read lines WLP0 and WLP1 with a voltage of a logic low level when receiving deactivated signals through the row lines WLR0 and WLR1. When receiving activated signals through the row lines WLR0 and WLR1, the voltage transformers VT 212 and 213 transfer a voltage P/R BIAS, which is received from the voltage supplier 220, to the program/read lines WLP0 and WLP1.

The voltage supplier 220 supplies a high voltage that may destroy the gate oxide of the e-fuses M1, M2, M3 and M4 to the voltage transformers VT 212 and 213 during a program operation, which is a rupture operation of a fuse. The high voltage is generated by pumping a power supply voltage. During a read operation, the voltage supplier 220 supplies a voltage appropriate for the read operation, which is usually a power supply voltage, to the voltage transformers VT 212 and 213.

The column control circuit 230 includes a column decoder 231, a current limiter 232, and a sense amplifier 233. The column decoder 231 electrically connects a selected column line among column lines BL0 and BL1 with the current limiter 232 by decoding the address ADD. The current limiter 232 is formed of a transistor that is controlled based on a bias voltage. The current flows from the selected column line among the column lines BL0 and BL1 to a ground voltage terminal. The sense amplifier 233 senses a data by comparing a voltage of an upper node of the current limiter 232 with a reference voltage VREF. When a memory cell selected by the row decoder 211 and the column decoder 231 is ruptured, current flows through the current limiter 232. Therefore, the sense amplifier 233 generates an output data OUTPUT in a logic high level. When the selected memory cell is not ruptured, no current flows through the current limiter 232. Therefore, the sense amplifier 233 generates an output data OUTPUT in a logic low level.

In a memory device including an e-fuse array, a data is recognized based on the resistance value of a memory cell. Therefore, when the resistance value of a memory cell that is ruptured or not ruptured may be accurately measured, reliability of the memory device may be improved considerably. However, since memory cells are arranged in the form of an array and there are many peripheral circuits, it is difficult to accurately measure the resistance value of a memory cell.

SUMMARY

An embodiment of the present invention is directed to a technology for accurately measuring the resistance value of a memory unit, which is a resistive memory device, such as an e-fuse array.

In accordance with an embodiment of the present invention, a memory device includes: a plurality of resistive memory units configured to receive a voltage of a corresponding line of a plurality of program/read lines; a plurality of switch units configured to each electrically connect a corresponding one of the resistive memory units with a corresponding column line of a plurality of column lines in response to a voltage of a corresponding row line of a plurality of row lines, where the program/read lines correspond to the row lines, respectively; a row control circuit configured to turn on the switch units by selecting at least one of the row lines and apply an external voltage to a program/read line corresponding to the selected row line in a first test mode; and a column control circuit configured to select at least one of the column lines and couple the selected column line with a ground voltage terminal in the first test mode.

In accordance with another embodiment of the present invention, a memory device includes: a memory array including a plurality of memory cells that each include a resistive memory unit and a switch unit; a row control circuit configured to select at least one of row lines, apply an external voltage to resistive memory units of the selected row line, and turn on switch units of the selected row line to electrically connect the resistive memory units of the selected row line with column lines, in a first test mode; and a column control circuit configured to select at least one of the column lines and electrically connect the selected column line with a ground voltage terminal in the first test mode.

In accordance with yet another embodiment of the present invention, a method for measuring a resistance value of a memory device includes: applying an external voltage to a pad; forming a first current path from the pad to a ground voltage terminal through a selected resistive memory unit and a switch unit and a column line corresponding to the selected resistive memory unit in a first test mode; calculating a resistance value of the first current path by measuring a current flowing through the pad in the first test mode; forming a second current path from the pad to the ground voltage terminal through a test switch unit and a test column line in a second test mode; and calculating a resistance value of the second current path by measuring a current flowing through the pad in the second test mode.

In accordance with still another embodiment of the present invention, a method for measuring a resistance value of a memory device includes: applying an external voltage to a pad; electrically connecting a selected resistive memory unit with a corresponding column line in a first test mode by applying the external voltage to the selected resistive memory unit and turning on a switch unit corresponding to the selected resistive memory unit; electrically connecting the column line corresponding to the selected resistive memory unit with a ground voltage terminal; calculating a resistance value of a first current path including the selected resistive memory unit and the switch unit and the column line corresponding to the selected resistive memory unit by measuring a current flowing through the pad in the first test mode; applying the external voltage to the corresponding column line through a test switch unit in a second test mode; and calculating a resistance value of a second current path including the test switch unit and the corresponding column line by measuring a current flowing through the pad in the second test mode.

DETAILED DESCRIPTION

Figure 1:
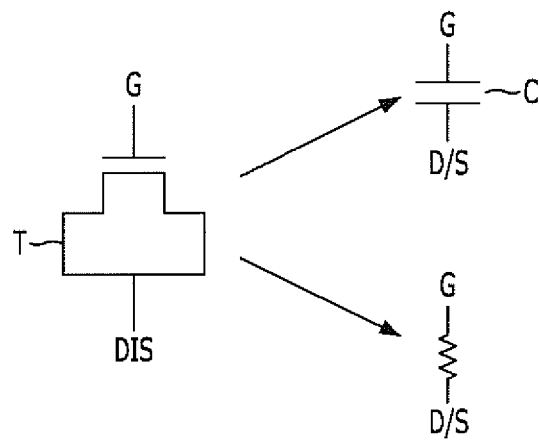
FIG. 1 illustrates an e-fuse formed of a transistor and operating as a resistor or a capacitor.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
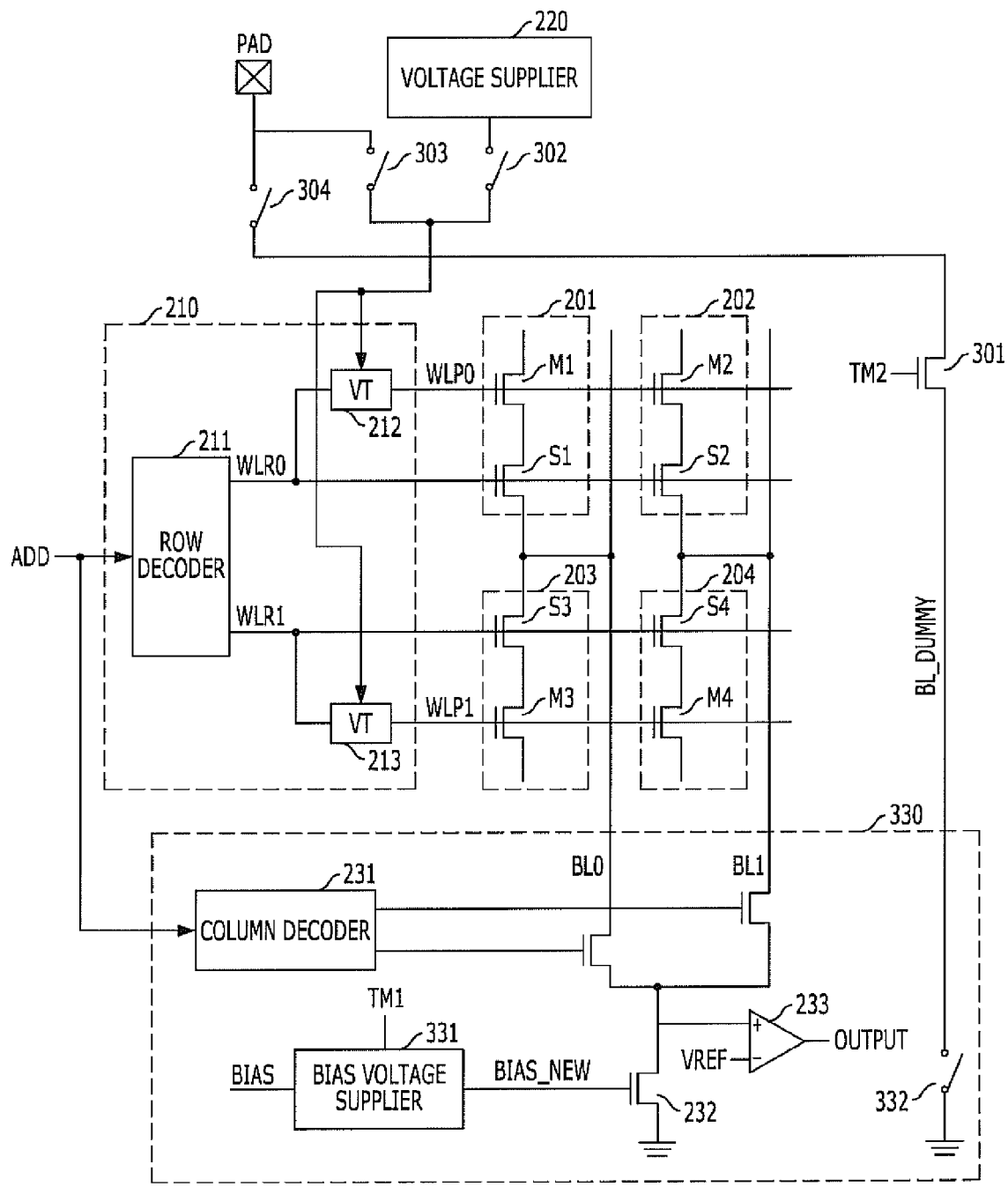
FIG. 3 is a block view illustrating a memory device in accordance with an embodiment of the present invention.

FIG. 3 is a block view illustrating a memory device in accordance with an embodiment of the present invention.

Referring to FIG. 3, the memory device includes a cell array including a plurality of memory cells 201, 202, 203 and 204, a row control circuit 210, a voltage supplier 220, a column control circuit 330, a pad PAD, a test switch unit 301, a test column line BL_DUMMY, and switches 302, 303 and 304.

The pad PAD receives an external voltage that is applied from the outside of the memory device. The external voltage may be applied from a test equipment (not shown) to the pad PAD of the memory device.

The test switch unit 301 is formed of the same device as the switch units S1, S2, S3 and S4. The test switch unit 301 is turned on when a second test mode signal TM2 is activated.

The switch 302 is turned on when at least one signal between a first test mode signal TM1 and the second test mode signal TM2 is activated. Otherwise, the switch 302 is turned off. The switch 303 is turned on when the first test mode signal TM1 is activated and turned off otherwise. The switch 304 is turned on when the second test mode signal TM2 is activated and turned off otherwise.

A bias voltage supplier 331 of the column control circuit 330 outputs a voltage for completely turning on a current limiter 232 to a 'BIAS_NEW' node, when the first test mode signal TM1 is activated. When the first test mode signal TM1 is deactivated, the bias voltage supplier 331 of the column control circuit 330 outputs an inputted bias voltage BIAS, which is the same voltage as the conventional bias voltage, to the 'BIAS_NEW' node. The bias voltage BIAS has such a level that the current limiter 232 has a resistance that is appropriate for a read operation. A switch 332 of the column control circuit 330 is turned on when the second test mode signal TM2 is activated and turned off otherwise.

Figure 2:
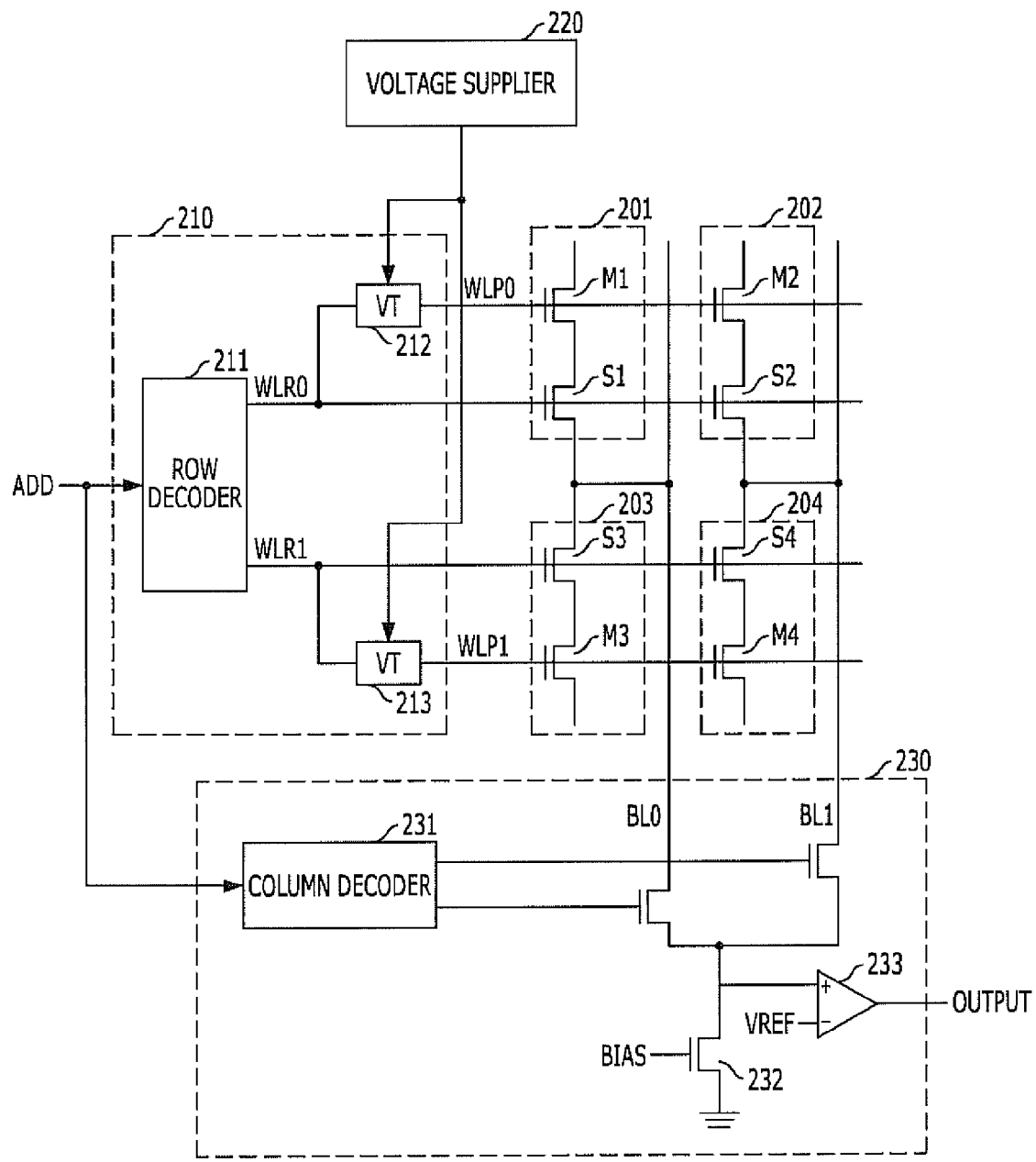
FIG. 2 is a block view illustrating a conventional memory device formed of an e-fuse array.

The constituent elements denoted by the same reference numerals as those of FIG. 2 are the same as those of FIG. 2. Therefore, detailed description on them is omitted here. Also, since an operation in a normal mode other than the operation in a test mode is the same as that of FIG. 2, it is not described here, either.

In this embodiment of the present invention, the resistance value of a memory unit of a selected memory cell is measured through a first test mode a second test mode. Hereinafter, the operation in the first test mode and the operation in the second test mode are described. For the description purposes, it is described that a row decoder 211 selects a $0^{th}$ row line WLR0, which is a row corresponding to a program/read line WLP0, and a column decoder 231 selects a first column line, which is a column corresponding to a column line BL1, in the first test mode. In short, a memory cell 202 is a selected memory cell. In the second test mode, no row and column are selected.

Operation in First Test Mode (First Test Mode Signal TM1 is Activated)

In the first test mode, an external voltage is applied from a test equipment in the outside of a memory device to the pad PAD. Since the switch 303 is turned on in the first test mode, the external voltage inputted to the pad PAD is transferred to voltage transformers VT 212 and 213. Since the row decoder 211 activates the signal of the $0^{th}$ row line WLR0, the voltage transformer VT 212 transfers the voltage inputted to the pad PAD to a memory unit M2 of the selected memory cell 202 through a program/read line WLP0. Also, a switch unit of the selected memory cell 202 is turned on by the signal of the row line WLR0. Meanwhile, the current limiter 232 is completely turned on by the bias voltage supplier 331 in the first test mode.

After all, in the first test mode, a current path from the pad PAD to a ground voltage terminal is formed though the memory unit M2 and the switch unit S2 of the selected memory cell 202 and the selected column line BL1. Therefore, when the amount of current flowing through the pad PAD is measured with the test equipment, the total resistance value of the selected memory unit M2 and switch unit S2 and the selected column line BL1 may be obtained.

Operation in Second Test Mode (Second Test Mode Signal TM2 is Activated)

In the second test mode, an external voltage is applied from a test equipment in the outside of a memory device to the pad PAD. Since the switch 304 is turned on in the second test mode, the external voltage inputted to the pad PAD is transferred to the test switch unit 301. Also, the test switch unit 301 is turned on in the second test mode, and the test column line BL_DUMMY is coupled with the ground voltage terminal by the switch 332 of the column control circuit 330.

After all, in the second test mode, a current path from the pad PAD to a ground voltage terminal is formed through the test switch unit 301 and the test column line BL_DUMMY. Therefore, when the amount of current flowing through the pad PAD is measured with the test equipment, the total resistance value of the test switch unit 301 and the test column line BL_DUMMY may be obtained.

In the first test mode, a resistance value (M2+S2+BL1) of the selected memory unit M2, switch unit S2, and column line BL1 is measured, while a resistance value (301+BL_DUMMY) of the test switch unit 301 and column line BL_DUMMY is measured in the second test mode. The resistance value of the selected switch unit S2 and the resistance value of the test switch unit 301 are the same, and the resistance value of the selected column line BL1 and the resistance value of the test column line BL_DUMMY are the same. Therefore, the resistance value of the selected memory unit M2 may be accurately measured by subtracting the total resistance value measured in the second test mode from the total resistance value measured in the first test mode with the test equipment.

Figure 4:
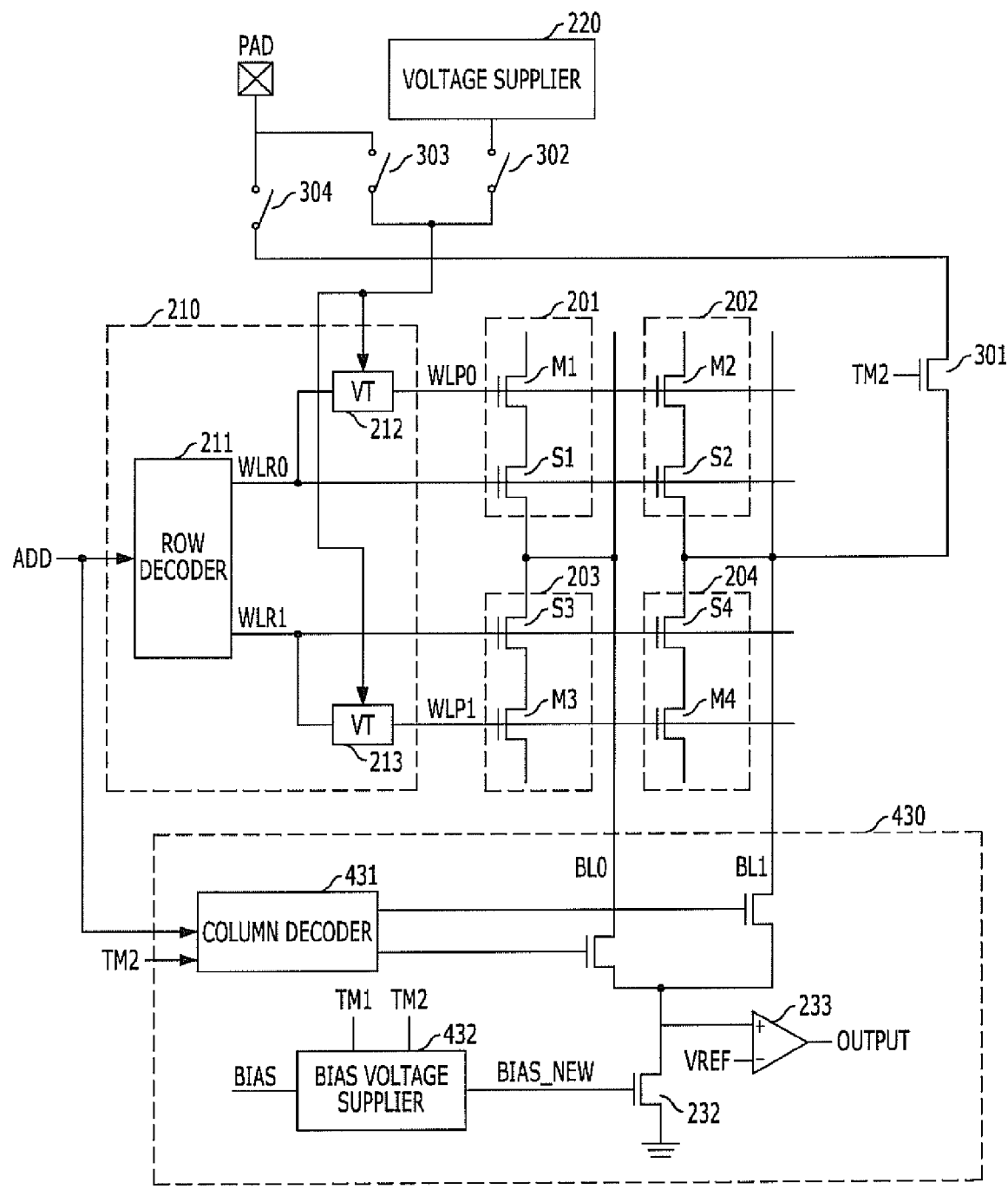
FIG. 4 is a block view illustrating a memory device in accordance with another embodiment of the present invention.

FIG. 4 is a block view illustrating a memory device in accordance with another embodiment of the present invention.

Referring to FIG. 4, the memory device includes a cell array including a plurality of memory cells 201, 202, 203 and 204, a row control circuit 210, a voltage supplier 220, a column control circuit 430, a pad PAD, a test switch unit 301, and switches 302, 303 and 304.

Differently from the embodiment of FIG. 3, the embodiment of FIG. 4 uses one of the existing column lines BL0 and BL1, for example, the column line BL1, instead of the test column line BL_DUMMY.

A column decoder 431 of the column control circuit 430 operates the same as the column decoder 231 in a normal mode and a first test mode. However, in a second test mode when a second test mode signal TM2 is activated, the column decoder 431 selects the column line BL1 that substitutes for the test column line BL_DUMMY regardless of an address ADD. A bias voltage supplier 432 of the column control circuit 430 outputs a voltage for completely turning on a current limiter 232 to a 'BIAS_NEW' node, when one signal between a first test mode signal TM1 and the second test mode signal TM2 is activated, and otherwise, outputs an inputted bias voltage BIAS to the 'BIAS_NEW' node.

The constituent elements denoted with the same reference numerals as those of FIGS. 2 and 3 are the same as those of FIGS. 2 and 3. Therefore, detailed description on them is omitted here.

In the embodiment of FIG. 4, too, the resistance value of a memory unit of a selected memory cell is measured through a first test mode and a second test mode. Hereinafter, the operation in the first test mode and the operation in the second test mode are described. For the description purposes, it is described that a row decoder 211 selects a $0^{th}$ row line WLR0, which is a row corresponding to a program/read line WLP0, and a column decoder 431 selects a first column line, which is a column corresponding to a column line BL1, in the first test mode. In short, a memory cell 202 is a selected memory cell. In the second test mode, no row and column are selected.

Operation in First Test Mode (First Test Mode Signal TM1 is Activated)

In the first test mode, an external voltage is applied from a test equipment in the outside of a memory device to the pad PAD. Since the switch 303 is turned on in the first test mode, the external voltage inputted to the pad PAD is transferred to voltage transformers VT 212 and 213. Since the row decoder 211 activated the signal of the $0^{th}$ row line WLR0, the voltage transformer VT 212 transfers the voltage inputted to the pad PAD to a memory unit M2 of the selected memory cell 202 through a program/read line WLP0. Also, a switch unit of the selected memory cell 202 is turned on by the signal of the row line WLR0. Meanwhile, the current limiter 232 is completely turned on by the bias voltage supplier 432 in the first test mode.

After all, in the first test mode, a current path from the pad PAD to a ground voltage terminal is formed through the memory unit M2 and the switch unit S2 of the selected memory cell 202 and the selected column line BL1. Therefore, when the amount of current flowing through the pad PAD is measured with the test equipment, the total resistance value of the selected memory unit M2 and switch unit S2 and the selected column line BL1 may be obtained.

Operation in Second Test Mode (Second Test Mode Signal TM2 is Activated)

In the second test mode, an external voltage is applied from a test equipment in the outside of a memory device to the pad PAD. Since the switch 304 is turned on in the second test mode, the external voltage inputted to the pad PAD is transferred to the test switch unit 301. Also, the test switch unit 301 is turned on in the second test mode, and the column line BL1 coupled with the test switch unit 301 is coupled with the ground voltage terminal through the current limiter 232, which maintains a complete turn-on state.

After all, in the second test mode, a current path from the pad PAD to a ground voltage terminal is formed through the test switch unit 301 and the column line BL1. Therefore, when the amount of current flowing through the pad PAD is measured with the test equipment, the total resistance value of the test switch unit 301 and the column line BL1 may be obtained.

In the first test mode, a resistance value (M2+S2+BL1) of the selected memory unit M2, switch unit S2, and column line BL1 is measured, while a resistance value (301+BL1) of the test switch unit 301 and the selected column line BL1 is measured in the second test mode. The resistance value of the selected switch unit S2 and the resistance value of the test switch unit 301 are the same. Therefore, the resistance value of the selected memory unit M2 may be accurately measured by subtracting the total resistance value measured in the second test mode from the total resistance value measured in the first test mode with the test equipment.

According to an embodiment of the present invention, a resistance value of a memory unit may be accurately measured.

While the present invention has been described with respect to the specific embodiments, it will be apparent to those skilled in the art that various changes and modifications may be made without departing from the spirit and scope of the invention as defined in the following claims.

Although the above-described embodiments of the present invention illustrates the cell array of a memory device including 2×2 memory cells, the size of the cell array may be different. Also, although the above-described embodiments of the present invention illustrates a method of measuring the resistance value of a memory unit, which is formed of an e-fuse, it is obvious to those skilled in the art that the technology of the present invention may be applied to measuring the resistance values of all kinds of resistive memory structures that are formed of devices other than e-fuses.

What is claimed is:

1. A memory device, comprising:
a pad configured to receive an external voltage;
a plurality of resistive memory units configured to receive a voltage of a corresponding line of a plurality of program/read lines;
a plurality of switch units configured to each electrically connect a corresponding one of the resistive memory units with a corresponding column line of a plurality of column lines in response to a voltage of a corresponding row line of a plurality of row lines, where the program/read lines correspond to the row lines, respectively;
a row control circuit configured to turn on the switch units by selecting at least one of the row lines and apply the external voltage to a program/read line corresponding to the selected row line in a first test mode; and
a column control circuit configured to select at least one of the column lines and couple the selected column line with a ground voltage terminal in the first test mod;
wherein the column control circuit comprises:
a column decoder configured to connect the selected column line with a first node;
a current limiter configured to limit current from the first node to the ground voltage terminal in response to a bias voltage;
a bias voltage supplier configured to generate the bias voltage such that the current limiter is completely turned on in the first test mode and the current limiter has a resistance appropriate for a read operation in a normal mode; and
a sense amplifier configured to sense data by comparing a voltage of the first node with a reference voltage.

2. The memory device of claim 1, further comprising:
test column line; and
a test switch unit having the same configuration as the switches and configured to receive a test mode signal,
wherein the external voltage is inputted to the pad and transferred to the test column line through the test switch unit and the column line is coupled with the ground voltage terminal, in a second test mode.

3. The memory device of claim 1, further comprising:
a test switch unit having the same configuration as the switches and configured to receive a test mode signal,
wherein the external voltage is inputted to the pad and transferred to the selected column line through the test switch unit in a second test mode, and wherein the bias voltage supplier generate the bias voltage such that the current limiter is completely turned on in the second mode.

4. The memory device of claim 2, wherein the resistive memory units includes e-fuses, and the program/read lines are coupled with gates of the e-fuses.

5. The memory device of claim 2, wherein when a first current path is formed from the pad to the ground voltage terminal through a resistive memory unit and a switch unit of the selected row line and the selected column line in the first test mode, a resistance value of the first current path is measured by using a current value thereof and the external voltage, and
when a second current path is formed from the pad to the ground voltage terminal through the test switch unit and the test column line in the second test mode, a resistance value of the second current path is measured by using a current value thereof and the external voltage,
wherein a resistance value of the resistive memory cell of the selected row line is calculated by comparing the resistance value of the first current path and the resistance value of the second current path.

6. A memory device, comprising:
a pad configured to receive an external voltage;
a memory array including a plurality of memory cells that each include a resistive memory unit and a switch unit;
a row control circuit configured to select at least one of a plurality of row lines, apply an external voltage to resistive memory units of the selected row line, and turn on switch units of the selected row line to electrically connect the resistive memory units of the selected row line with column lines, in a first test mode; and
a column control circuit configured to select at least one of the column lines and electrically connect the selected column line with a ground voltage terminal in the first test mode,
wherein the column control circuit comprises:
a column decoder configured to connect the selected column line with a first node;
a current limiter configured to limit current from the first node to the ground voltage terminal in response to a bias voltage;
a bias voltage supplier configured to generate the bias voltage such that the current limiter is completely turned on in the first test mode and the current limiter has a resistance appropriate for a read operation in a normal mode; and
a sense amplifier configured to sense data by comparing a voltage of the first node with a reference voltage.

7. The memory device of claim 6, further comprising:
a test column line; and
a test switch unit having the same configuration as the switches and configured to receive a test mode signal,
wherein the external voltage is inputted to the pad and transferred to the test column line through the test switch unit and the test column line is coupled with the ground voltage terminal, in a second test mode.

8. The memory device of claim 6, further comprising:
a test switch unit having the same configuration as the switches and configured to receive a test mode signal,
wherein the external voltage is inputted to the pad and transferred to the selected column line through the test switch unit in a second test mode, and
wherein the bias voltage supplier generate the bias voltage such that the current limiter is completely turned on in the second test mode.

* * * * *